United States Patent
Chen et al.

(10) Patent No.: US 7,282,905 B2
(45) Date of Patent: Oct. 16, 2007

(54) SYSTEM AND METHOD FOR IDDQ MEASUREMENT IN SYSTEM ON A CHIP (SOC) DESIGN

(75) Inventors: Wei Chen, Plano, TX (US); Hugh T. Mair, Fairview, TX (US); Uming Ko, Plano, TX (US); David B. Scott, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/010,135

(22) Filed: Dec. 10, 2004

(65) Prior Publication Data

US 2006/0125470 A1   Jun. 15, 2006

(51) Int. Cl.
*G01R 31/26* (2006.01)
(52) U.S. Cl. ............... 324/158.1; 324/765; 324/769
(58) Field of Classification Search ............... None
See application file for complete search history.

(56) References Cited

U.S. PATENT DOCUMENTS

2004/0027160 A1* 2/2004 Joshi et al. ............ 326/81
2005/0127756 A1* 6/2005 Shepard et al. ............ 307/18

* cited by examiner

*Primary Examiner*—Minh N. Tang
(74) *Attorney, Agent, or Firm*—Dolly Wu; W. James Brady; Frederick J. Telecky, Jr.

(57) ABSTRACT

System and method for detecting transistor failure in large-scale integrated circuits by measuring IDDQ. A preferred embodiment comprises a switch structure for an integrated circuit made up of a plurality of main switches (such as main switch 410) selectively coupling a power sub-domain to a power source pin, a plurality of pi-switches (such as pi-switch 415) selectively coupling pairs of power sub-domains, and a plurality of IDDQ switches (such as IDDQ switch 425) selectively coupling the power sub-domains to a VIDDQ pin. The pi-switches can decouple the power sub-domains while the IDDQ switches can enable the measurement of the quiescent current in the power sub-domains. The use of pi-switches and IDDQ switches can permit the measurement of the quiescent current in the power sub-domains without requiring the use of isolation buffers and needed to powering on and off the integrated circuit between current measurements in the different power sub-domains.

8 Claims, 13 Drawing Sheets

SYSTEM AND METHOD FOR IDDQ MEASUREMENT IN SYSTEM ON A CHIP (SOC) DESIGN

CROSS-REFERENCE TO RELATED APPLICATIONS

This application is related to the following and commonly assigned patent applications: Ser. No. 10/735,943, now U.S. Pat. No. 7,180,208, filed Dec. 15, 2003, entitled "Switch Structure for Reduced Voltage Fluctuation in Power Domains and Sub-Domains," which application is hereby incorporated herein by reference.

TECHNICAL FIELD

The present invention relates generally to a system and method for integrated circuit manufacturing, and more particularly to a system and method for detecting transistor failure in large-scale integrated circuits by measuring IDDQ.

BACKGROUND

As integrated circuits continue to increase in complexity and total number of devices, the probability of a failure may remain the same or decrease, but the probability of an integrated circuit containing a fault increases. In many integrated circuits, a certain degree of redundancy is built into the integrated circuit that will permit the faulty portions to be replaced. However, the faulty portions of the integrated circuit must first be detected.

A technique that can be used to detect transistor failures in an integrated circuit is to measure the quiescent current (IDDQ). If the IDDQ measurement is different from an expected range of values, then it is determined that there is a failure of at least one transistor in the integrated circuit. By partitioning the integrated circuit into different regions, typically along different power-domains, it may be possible to narrow down the location of the failed transistor and implement a remedy.

In a prior art technique, the testing of an integrated circuit makes use of a switched array structure and can involve powering up individual power-domains and then scanning in test vectors for the powered power-domain and scanning out the results. The entire integrated circuit can then be tested by repeating the powering up, scanning in, and scanning out for each of the power-domains.

One disadvantage of the prior art is the powering up, scanning in, and scanning out of each of the individual power domains can be time consuming. With a complex integrated circuit, such as a system on a chip (SOC), the total testing time can be great. This can reduce the number of integrated circuits that can be tested, perhaps resulting in the need for a large number of testing stations (which can be expensive) to meet production and testing demands.

A second disadvantage of the prior art is that logic isolation between the power domains is required. Logic isolation adds more gates and can increase logic complexity as well as having a potentially adverse effect upon critical timing paths across power domains. Additionally, design for test (DFT) requirements have to be added to each power domain. DFT requirements for each power domain can require that clock signals for each power domain may have to be bypassed during test mode and that power control signals to the power domains remain on during testing. This can lead to the need of a separate scan chain for each power domain.

A third disadvantage of the prior art is that by testing individual power-domains, the individual power-domains need to be isolated from one another. To isolate the power-domains, isolation buffers need to be implemented in the integrated circuit. The isolation buffers tend to be large, in a typical SOC, to properly isolate the power-domains, the chip area consumed by the isolation buffers may account for approximately 10 percent of the total chip area.

Yet another disadvantage of the prior art is that it prohibits the measurement of sub-power-domain IDDQ since internal VDD nodes are shorted together. By not permitting sub-power-domain measurement of IDDQ, fine grained failed transistor testing is not possible, thereby reducing the ability to accurately locate a faulty transistor.

SUMMARY OF THE INVENTION

These and other problems are generally solved or circumvented, and technical advantages are generally achieved, by preferred embodiments of the present invention which provides for a system and method for detecting transistor failure in large-scale integrated circuits by measuring IDDQ.

In accordance with a preferred embodiment of the present invention, a switch structure comprising a plurality of main switches and a plurality of IDDQ switches is provided. Wherein each main switch selectively couples a power sub-domain to a power supply and each IDDQ switch selectively couples a power sub-domain to a VIDDQ pin, wherein there is one main switch and one IDDQ switch for each power sub-domain.

In accordance with another preferred embodiment of the present invention, an integrated circuit testing structure comprising an integrated circuit containing a switch structure, a current measuring device coupled to a VIDDQ pin of the integrated circuit, and a scan memory coupled to the integrated circuit is provided. Wherein the switch structure of the integrated circuit is configured to enable the measurement of a quiescent current in each of a plurality of power sub-domains in the integrated circuit, wherein the current measurement device is configured to measure a current draw by the integrated circuit when the integrated circuit is in a test mode, and wherein the scan memory is to store test vectors to be scanned into the integrated circuit.

In accordance with another preferred embodiment of the present invention, a method for testing an integrated circuit is provided. The method comprises placing the integrated circuit into a test mode, isolating individual power sub-domains in the integrated circuit, measuring a quiescent current for each power sub-domain, and determining if a fault exists in the individual power sub-domains based upon the quiescent currents.

An advantage of a preferred embodiment of the present invention is that by maintaining constant power to the integrated circuit under test, test time is not spent having to wait for the integrated circuit to power down and then power up. Furthermore, a single set of test vectors can be scanned in for the entire integrated circuit and similarly, a single set of test results need to be scanned out. This results in a shorter overall test time for the integrated circuit. Therefore, more integrated circuits can be tested for a given amount of time and number of testing stations. However, should additional scan chains be desired, additional scan chains can be used.

A further advantage of a preferred embodiment of the present invention is that isolation buffers are not needed to isolate the individual power-domains. The elimination of the isolation buffers can reduce the overall chip area needed, resulting in a smaller integrated circuit.

Yet another advantage of a preferred embodiment of the present invention is that sub-power-domain IDDQ measurements can be made. This can allow for more accurate location of a faulty transistor, thereby allowing for easier replacement of the faulty device.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a system on a chip integrated circuit containing a large number of integrated circuits, with multiple power-domains. The invention may also be applied, however, to other integrated circuits with multiple power-domains, wherein there is a desire to rapidly test for faulty transistors by measuring IDDQ.

Figure 1:
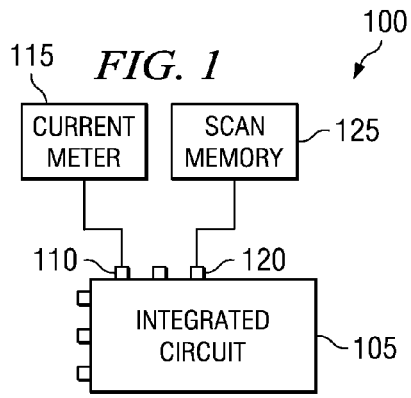
FIG. 1 is a diagram of a test structure for the testing of an integrated circuit.

With reference now to FIG. 1, there is shown a diagram illustrating a test structure 100 for the testing of an integrated circuit 105 by measuring IDDQ currents. Note that the diagram is a simplified view of the test configuration 100 with typical test equipment, such as test fixtures, power supplies, and so forth, not shown. The integrated circuit 105 may have been packaged prior to the testing or it may be tested prior to packaging. In order to facilitate testing, the integrated circuit 105 may have several input/output pins that can be dedicated to testing. For example, a first pin 110 can be used to permit the coupling of a current meter 115 while a second pin 120 can be used to permit the coupling of a scan memory device 125. Note that more than two pins can be used for testing purposes. Furthermore, through pin multiplexing, a single pin can be used (not shown in FIG. 1). The first pin 110 can permit the current meter 115 to measure the IDDQ of the integrated circuit while the second pin 120 can permit the scanning in of test vectors from the scan memory device 125. Additionally, the second pin 120 can also be used to scan out test results into the scan memory device 125.

In this context, the term "pin" is used to describe an external contact point from the integrated circuit. While the external contact can physically be configured as a pin, it is understood that other types of contacts (e.g., solder balls in a ball grid array package) also fall under the term "pin."

Figure 2:
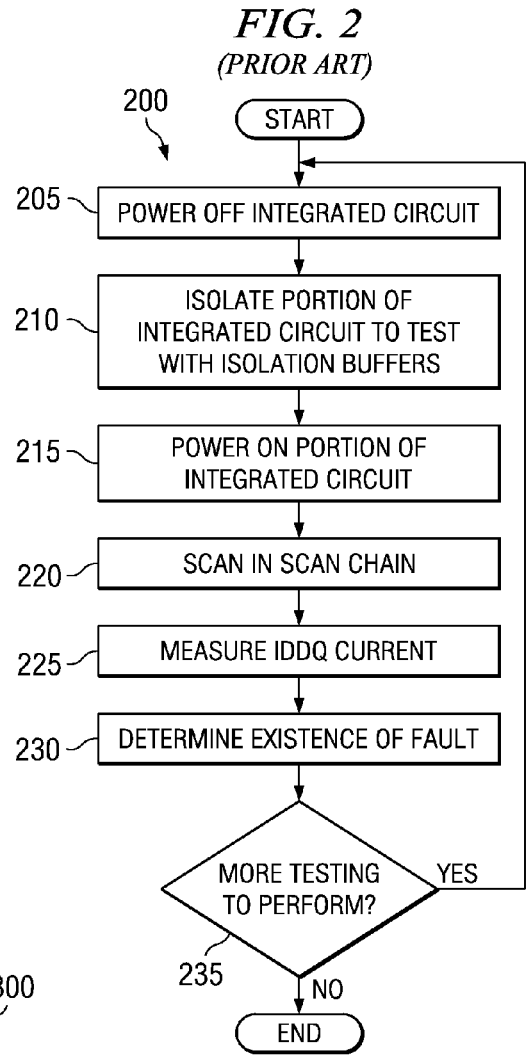
FIG. 2 is a diagram of a sequence of events for a prior art technique of integrated circuit testing.

With reference now to FIG. 2, there is shown a diagram illustrating a sequence of events 200 that can occur in a prior art technique of integrated circuit testing, wherein individual power-domains are tested. The sequence of events 200 describes an exemplary scenario for the testing of an integrated circuit with multiple power-domains, wherein the integrated circuit features a switch array structure. To begin the testing of the integrated circuit, the integrated circuit is initially powered off (block 205). After powering off the integrated circuit, a particular power-domain to be tested can be isolated from other power-domains by configuring the isolation buffers in the integrated circuit (block 210).

Once the power-domain to be tested has been isolated from the rest of the integrated circuit (block 210), then the power-domain can be powered on (block 215). Although not shown in the sequence of events 200, the powering on of the power-domain can involve a wait for a period of time to ensure that the power being supplied to the power-domain is stable and that the circuitry in the power-domain is at operating conditions. Once the power supply is stable and the circuitry is at operating conditions, test vectors can be scanned in (block 220) and the IDDQ current can be measured (block 225). With the IDDQ current measured, the existence of a fault can be determined (block 230). A fault can be present if the IDDQ current exceeds a specified threshold. The threshold can be different depending upon the number of transistors in the power-domain being tested and the process technology used to fabricate the integrated circuit. Also not shown, it may be possible to scan out the results of the test. After measuring the IDDQ current for the power-domain, the need to perform further testing can be determined (block 235). If there are additional power-domains to test, the described sequence of events 200 can be repeated for each of the additional power-domains. If there are no additional power-domains to test, then sequence of events 200 is complete.

Figure 3A:
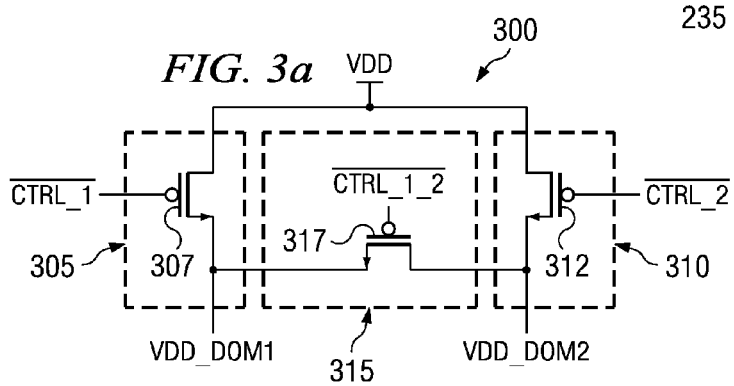
FIGS. 3a through 3c are diagrams of circuits for providing power to two power sub-domains with reduced voltage fluctuations, according to a preferred embodiment of the present invention.

With reference now to FIG. 3a, there is shown a diagram illustrating a circuit 300 for providing power to two power domains (or power sub-domains) with reduced voltage fluctuations, according to a preferred embodiment of the present invention. The circuit 300 features two power domain power sources 305 and 310. In addition to being used to reduce voltage fluctuations in power domains, the circuit 300 may also be used to reduce voltage fluctuations in power sub-domains. A single power domain may be made up of a plurality of power sub-domains. Power sub-domains can be used to separate power delivery to different circuits within a single power domain. Power sub-domains, by definition, have common voltage requirements.

A switch structure 315 may be used to couple the two power domain power sources 305 and 310 together. Note that the switch structure 315 can be referred to as a "pi-switch." The switch structure 315 can couple outputs from the two power domain power sources 305 and 310 together to help ensure that the voltage provided to the two power domains are the same. Transistors 307 and 312 can be used as the two power domain power sources 305 and 310. The transistors 307 and 312 can be coupled to a power supply "VDD" and when closed, can couple the power supply "VDD" to the power domains. The transistor 307 can be referred to as a main switch for power sub-domain 1 and the transistor 312 can be referred to as a main switch for power sub-domain 2. The switch structure 315 may be made from a single transistor 317, with the transistor's source coupled to the output of one of the power domain power sources and the transistor's drain coupled to the output of the other power domain power source. The switch structure 315 may be controlled by a control signal, "CTRL_1_2." The control signal may be used to couple/decouple the outputs of the two power domain power sources. As in the control signals for the power domain power sources, the control signal "CTRL_1_2" may be an active low signal. For example, if the control signal closes the switch (the transistor 317) in the switch structure 315, then the outputs may be coupled and if the control signal opens the switch, then the outputs may be decoupled.

According to a preferred embodiment of the present invention, the control signal "CTRL_1_2" may be an external signal, which can be provided outside of the circuit 300. Alternatively, the control signal "CTRL_1_2" may be logically derived from other control signals. For example, the control signal "CTRL_1_2" may be the logical AND of the control signals "CTRL_1" and "CTRL_2." Therefore, if both the power domain power sources 305 and 310 are on (therefore control signals "CTRL_1" and "CTRL_2" are on), then the control signal "CTRL_1_2" may be on to couple the outputs of the two power domain power sources together. If one or both of the power domain power sources 305 and 310 is off, then the control signal "CTRL_1_2" may then be off to decouple the outputs of the two power domain power sources. Note that the control signal "CTRL_1_2" may be derived from the control signals "CTRL_1" and "CTRL_2" using other logical expressions without changing the spirit of the present invention.

As shown in FIG. 3a, the switching structure 315 may be constructed out of a transistor, namely a P-type MOSFET (metal oxide semiconductor field-effect transistor). However, other types of transistors, such as an N-type MOSFET can be used to build the switching structure 315. For non-integrated solutions, it is possible to use other forms of switches, such as relays and simple switches, to implement the switching structure. In situations wherein leakage may be a concern, the switching structure 315 (and perhaps the transistors 307 and 312) may be made out of thick oxide which may result in slow transistors with low leakage.

Furthermore, the transistors 307 and 312, used to control the flow of the current from the power source VDD, may be approximately the same size (length, width, and cross-section) while the transistor 317 in the switching structure 315 may have a width that can be as small as 10 to 20 percent of the width of the two transistors 307 and 312. This can be due to the fact that the transistor 317 in the switching structure 315 may not have to handle as much current as the transistors 307 and 312 and needs to only be sized accordingly.

Note that the design of the circuit 300 can be readily extended for use in power sub-domains. The circuit 300 shown in FIG. 3 can be used in a power sub-domain since within a power sub-domain, the voltage requirements across the power sub-domains may be constant. Additionally, each power sub-domain may be independently turned on and off. For the case when power sub-domains are on, their respective outputs may be coupled together to reduce voltage fluctuation.

Figure 3B:
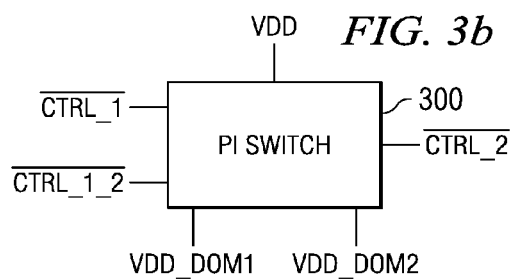

With reference now to FIG. 3b, there is shown a diagram illustrating a logical representation of the circuit 300 displayed in FIG. 3a, according to a preferred embodiment of the present invention. As discussed above, the circuit 300 can have three control signals (CTRL_1, CTRL_2, and CTRL_1_2), a power input (VDD), and two outputs (VDD_DOM 1 and VDD_DOM 2). The logical representation of the circuit 300 can be referred to as a pi-switch.

Figure 3C:
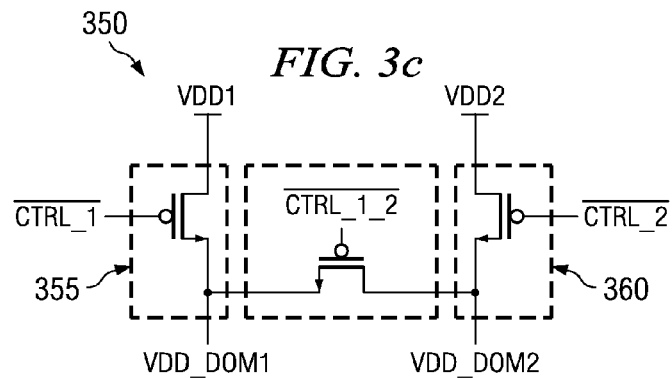

With reference now to FIG. 3c, there is shown a diagram illustrating a circuit 350 for providing power to two power domains (or power sub-domains) with reduced voltage fluctuations, wherein the circuit may be powered by separate power inputs, according to a preferred embodiment of the present invention. The circuit 300 is powered by a single power input that is shared by the two power domain power sources 305 and 310. However, in certain situations, it may be preferred (or required) that the power domain power sources be powered by separate power sources. In the circuit 350, two power domain power sources 355 and 360 may be powered by separate power sources, VDD1 and VDD2, respectively. Note that even with separated power sources, the circuit 350 may operate in a manner that is consistent with the circuit 300.

Figure 4:
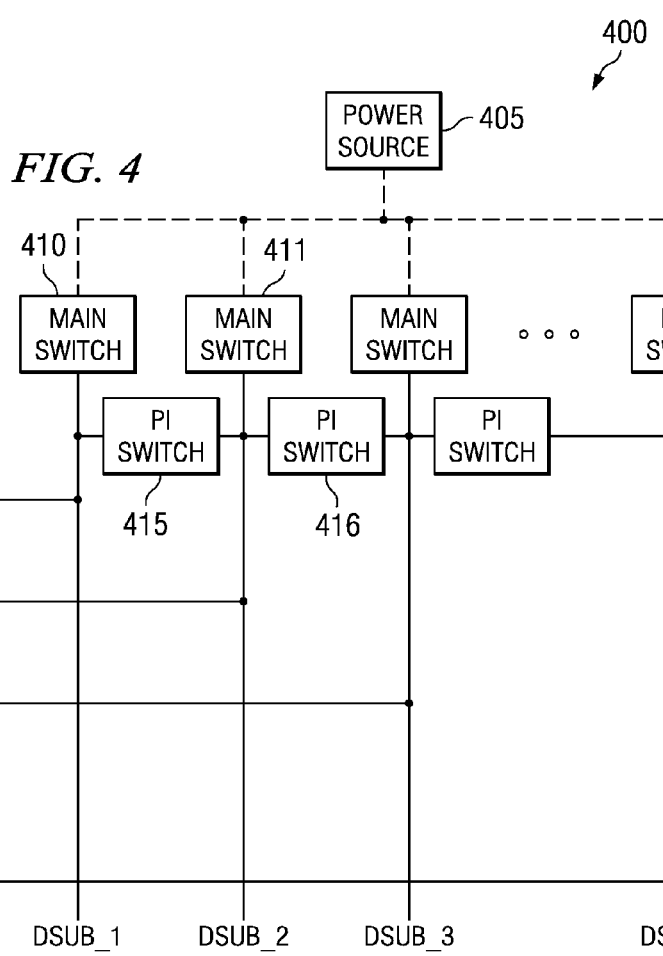
FIG. 4 is a diagram of a generic switch structure that permits IDDQ-based testing of an integrated circuit, according to a preferred embodiment of the present invention.

With reference now to FIG. 4, there is shown a diagram illustrating a generic switch structure 400 that permits IDDQ-based testing of an integrated circuit, according to a preferred embodiment of the present invention. FIG. 4 illustrates a generic switch structure 400 that can be used to create an integrated circuit that permits IDDQ-based testing. The generic switch structure 400 includes a power source 405. The power source 405 may actually be a power supply (or a plurality of power supplies) or it may be an input/output pin (or multiple input/output pins) for the integrated circuit wherein power can be provided to the integrated circuit. The input/output pins may be used for other purposes through a technique commonly referred to as pin multiplexing.

The generic switch structure 400 may have a plurality of main switches (such as main switches 410 and 411). Each of the main switches can be used to couple the power source 405 to a power sub-domain. Note that if multiple power supplies or input/output pins are used to implement the power source 405, the power provided to the individual power sub-domains can differ. Pi-switches (such as pi-switches 415 and 416) can be used to help minimize adjacent power sub-domain ripple and/or to provide a decoupling of adjacent power sub-domains.

The generic switch structure 400 can provide the IDDQ-based testing by including a VIDDQ pin 420 to enable the capability of measuring the IDDQ current for the power sub-domains. The VIDDQ pin 420 may be implemented as a single input/output pin, multiple input/output pins, a multiplexed input/output pin to enable multiple uses for the input/output pin, multiple multiplexed input/output pins. A plurality of IDDQ switches (such as IDDQ switches 425 and 426) can coupled the VIDDQ pin 420 to the plurality of power sub-domains. If the VIDDQ pin 420 is implemented as a single input/output pin, then the IDDQ switches would be closed one at a time to enable the IDDQ for a corresponding power sub-domain to be measured. However, if multiple VIDDQ pins are used, then it may be possible to measure multiple IDDQ currents in parallel. Note that since the IDDQ currents being measured are relatively small, the IDDQ switches do not have to be large. Simulation studies have shown that IDDQ switches on the order of $1000^{th}$ the size of a main switch (such as main switch 410) can be adequate.

The generic switch structure 400 provides a general framework for creating different switch structures by changing the implementation of the power source 405 and the VIDDQ pin 420, for example. With the pi-switch structure (discussed above) and use of circuits and topologies such as separate IDDQ switches and power-supply pin multiplexing, it is possible to create switch structures that enable reliable and efficient IDDQ-based testing. Multiple topologies are possible, some of them are described below. However, additional variations and structures can be created through trivial extensions of those described herein by those of ordinary skill in the art of the present invention.

Figure 5A:
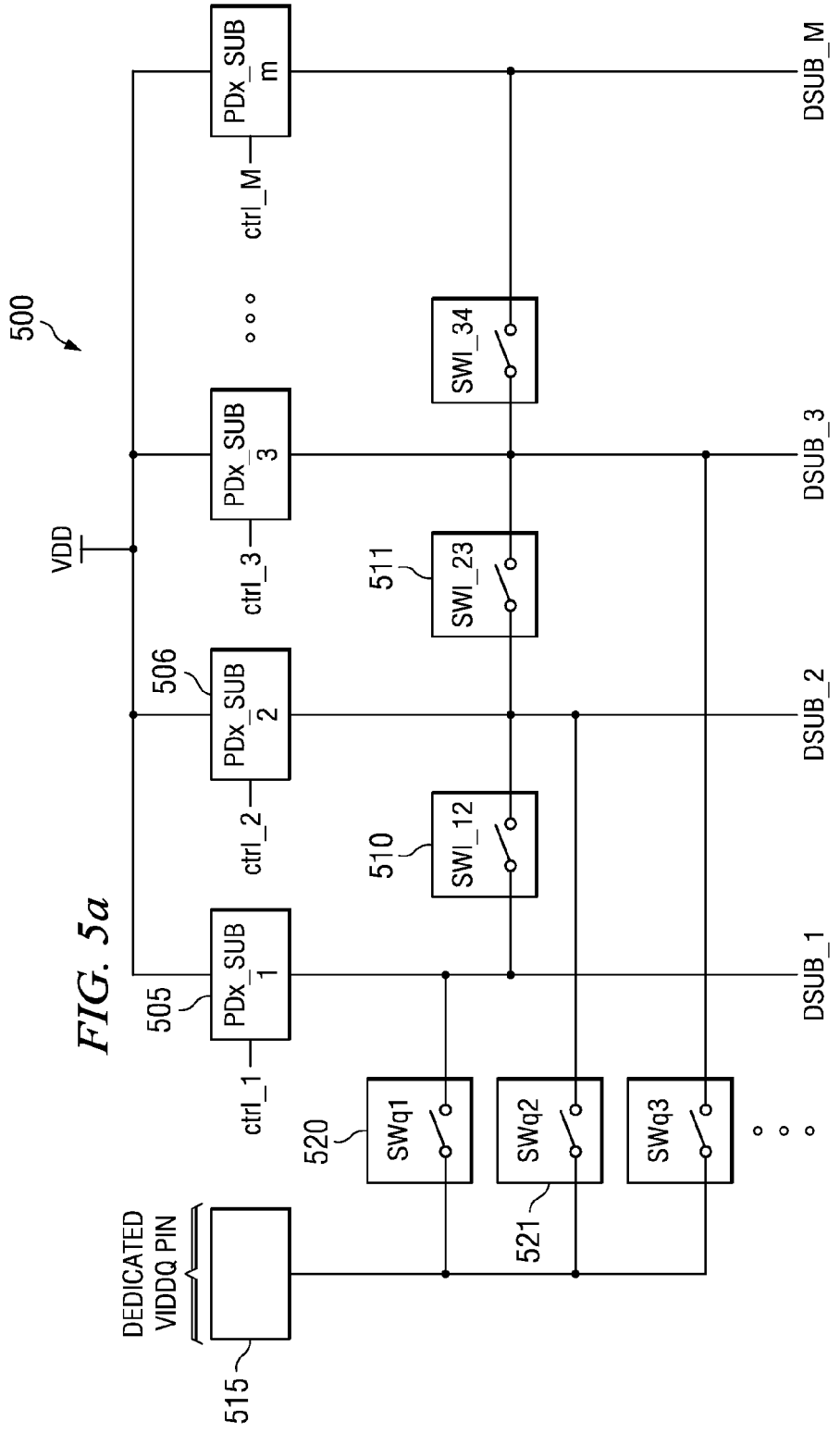
FIGS. 5a and 5b are diagrams of a switch structure using dedicated IDDQ switches and a VIDDQ pin and a sequence of events for the IDDQ-based testing of an integrated circuit, according to a preferred embodiment of the present invention.

With reference now to FIG. 5a, there is shown a diagram illustrating a switch structure 500 using dedicated IDDQ switches and a VIDDQ pin, according to a preferred embodiment of the present invention. According to a preferred embodiment of the present invention, the switch structure 500 may be included as a part of an integrated circuit. In the switch structure 500, the power source 405 (FIG. 4) is represented as a single voltage supply "VDD" that may be provided to the integrated circuit via a power supply pin (not shown). The switch structure 500 features main switches (such as switches 505 and 506) for each power sub-domain and pi-switches (such as switches 510 and 511) used to interconnect the power sub-domains. The main switches 505 and 506 can be similar to the power domain sources 305 and 310 shown in FIG. 3a, while the pi-switches 510 and 511 may be similar to the switch structure 315 (also shown in FIG. 3a). The main switches 505 and 506 may be controlled by control signals "CTRL_1" and "CTRL_2" respectively, while the pi-switches 510 and 511 may be controlled by control signals "SWI_12" and "SWI_23." As discussed above, the main switches 505 and 506 can regulate the power from a common power supply "VDD" to the different power sub-domains (DSUB_1 and DSUB_2) and the pi-switches 510 and 511 can couple (or decouple) the power sub-domains DSUB_1 and DSUB_2 together or DSUB_2 and DSUB_3. Refer to a co-assigned and co-pending patent application: Ser. No. 10/735,943, filed Dec. 15, 2003, entitled "Switch Structure for Reduced Voltage Fluctuation in Power Domains and Sub-Domains," for a detailed discussion of the operation and design of the main switches and the pi-switches.

The switch structure 500 also includes a single dedicated VIDDQ pin 515 (implementing the VIDDQ pin 420 (FIG. 4)) and a series of IDDQ switches (such as IDDQ switches 520 and 521) controlled by control signals (such as SWQ1 and SWQ2). Note that there can be as many IDDQ switches as there are power sub-domains and that the size of the IDDQ switches can be as small as approximately one (1) percent of that of the main switches due to their relatively low current handling requirements. An IDDQ switch (such as IDDQ switch 520) can be used to couple the dedicated VIDDQ pin 515 to a power sub-domain (such as power sub-domain DSUB_1). When the IDDQ switch 520 is closed, it is possible to measure a current flow on the dedicated. VIDDQ pin 515.

Therefore, to measure the IDDQ current for the DSUB_1 power sub-domain, the main switch 505 should be closed (to provide a current path) with the remaining main switches also closed (the remaining main switches should be closed to maintain power to the remaining power sub-domains), the pi-switch 510 should be open to isolate the DSUB_1 power sub-domain from the DSUB_2 power sub-domain (the remaining pi-switches can be either open or closed), and the IDDQ switch 520 should be closed to coupled the dedicated VIDDQ pin 515 to the DSUB_1 power sub-domain (the remaining dedicated IDDQ switches should be open). Then, when the measurement is to take place, the main switch 505 should be open and the IDDQ current measured at the dedicated VIDDQ pin 515.

Figure 5B:
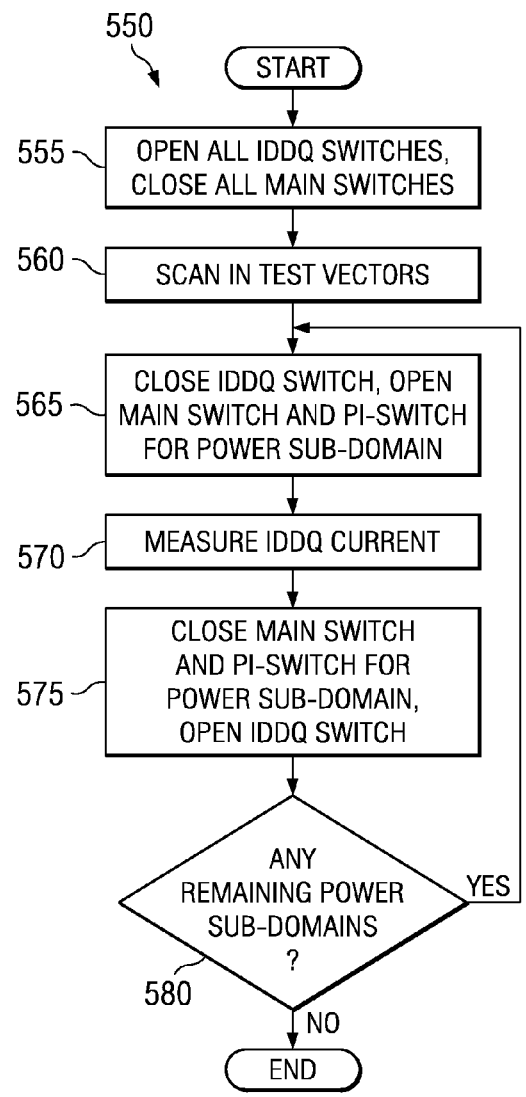

With reference now to FIG. 5b, there is shown a diagram illustrating a typical sequence of events 550 for the IDDQ-based testing of an integrated circuit, according to a preferred embodiment of the present invention. Note that the discussion of the sequence of events 550 focuses on the measurement of the IDDQ current for the DSUB_1 power sub-domain. However, the measurement of the IDDQ current for other power sub-domains is similar and should be readily evident from the discussion of the IDDQ current measurement for the DSUB_1 power sub-domain.

Initially, all IDDQ switches (such as IDDQ switches 520 and 521) should be open and all main switches (such as main switches 505 and 506) should be closed (block 555). Note that the pi-switches (such as pi-switches 510 and 511) can either be closed or open. The test vectors can then be scanned in (block 560). The test vectors for the entire integrated circuit can be scanned in, rather than just the test vectors for a single power sub-domain. To measure the IDDQ current for the DSUB_1 power sub-domain, the IDDQ switch 520 should then be closed and the main switch 505 and the pi-switch 510 should be open (the remainder of the main switches should be closed and the remainder of the pi-switches can either be open or closed) (block 565). The IDDQ current for the DSUB_1 power sub-domain can now be measured at the dedicated VIDDQ pin 515 (block 570). After the IDDQ current is measured, the main switch 505 and the pi-switch 510 should be closed and the IDDQ switch 520 should be open (block 575). If there are any remaining power sub-domains to test (block 580), the switch adjustments (blocks 565 and 575) and current measurements (block 570) can be repeated, else the testing can terminate.

Figure 6B:
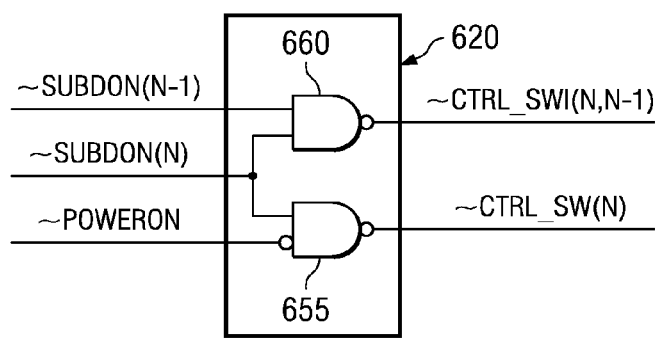
FIGS. 6a and 6b are diagrams of an implementation of the switch structure shown in FIG. 5a and a logic block used in the generation of control signals for the switches in the switch structure, according to a preferred embodiment of the present invention.
Figure 6A:
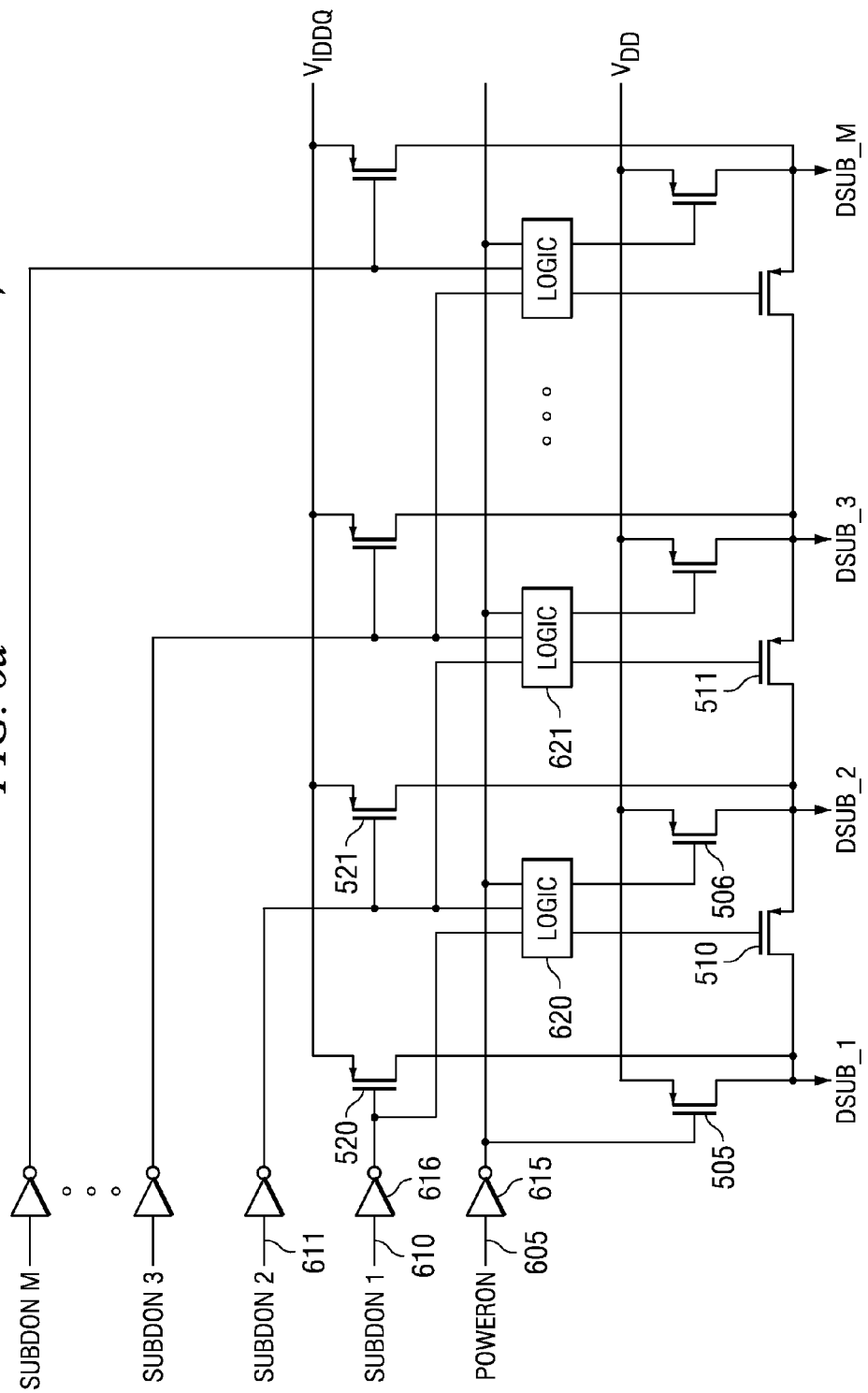

With reference now to FIG. 6a, there is shown a diagram illustrating a detailed view of an exemplary implementation of the switch structure 500, according to a preferred embodiment of the present invention. As discussed previously, the main switches (such as main switches 505 and 506), the pi-switches (such as pi-switches 510 and 511), and the IDDQ switches (such as IDDQ switches 420 and 421) can be implemented using transistors, preferably PMOS transistors. A central power enable signal line "POWERON" 605 can be used to close or open the main switches, while a series of IDDQ switch enable signal lines (such as "SUBDON_1" 610 and "SUBDON_2" 611) can be used to close or open the IDDQ switches (such as IDDQ switches 520 and 521). Note that since PMOS transistors are used to implement the switches, inverters (such as inverters 615 and 616) are present on the enable signal line to ensure proper signal polarity.

The implementation of the switch structure 500 includes a plurality of logic blocks (such as logic block 620 and 621) which can be used to generate control signals for controlling the states of the main switches and the pi-switches. Each logic block may have several inputs and several outputs. For example, the logic block 620 may have three inputs: the central power enable signal line "POWERON" 605, the IDDQ switch enable signal lines "SUBDON_1" 610 and "SUBDON_2" 611. The logic block 620 may have two outputs: a control line for the main switch 506 and the pi-switch 510. Note that since different logic blocks are used to control different main and pi-switches, the inputs can differ for different logic blocks. A detailed examination of an exemplary logic block is provided below.

According to a preferred embodiment of the present invention, for normal integrated circuit operation, the central power enable signal line "POWERON" 605 is set at "1" (for closed) and the plurality of IDDQ switch enable signal lines "SUBDON_1" to "SUBDON_M" are set at "0" (for open). When operating in test mode and the test vectors are being scanned in, the central power enable signal line "POWERON" 605 is set at "1" (for closed) and the plurality of IDDQ switch enable signal lines "SUBDON_1" to "SUBDON_M" are set at "0" (for open). When operating in test mode and measuring the IDDQ current for the DSUB_1 power sub-domain, the IDDQ switch enable signal line "SUBDON_1" is set to "1" (closed) while the remaining IDDQ switch enable signal lines are set to "0" (open).

With reference now to FIG. 6b, there is shown a diagram illustrating a detailed view of a logic block (such as the logic block 620), according to a preferred embodiment of the present invention. The logic block (such as the logic block 620) may be implemented using two two-input logic gates, preferably NAND gates: a first NAND gate 655 and a second NAND gate 660. The implementation of the switch structure 500 makes use of a plurality of logic blocks and each logic block can have different inputs and can generate outputs that control different main switches and pi-switches. For example, the logic block 620 may have as input the central power enable signal line "POWERON" 605 and the IDDQ switch enable signal lines "SUBDON_1" and "SUBDON_2" while the logic block 621 may have has input the central power enable signal line "POWERON" 505 and the IDDQ switch enable signal lines "SUBDON_2" and "SUBDON_3." Similarly, the output of the logic block 520 can be used to control the main switch 506 and the pi-switch 510. In general, the N-th logic block may have as input the central power enable signal line "POWERON" 605 and the IDDQ switch enable signal lines "SUBDON_N−1" and "SUBDON_N," while its outputs drive the N-th main switch and the pi-switch for power sub-domains N−1 and N.

According to a preferred embodiment of the present invention, the outputs of the N-th logic block can be expressed as:

~CTRL_SW(*N*)=~(~SUBDON(*N*−1) AND~SUBDON(*N*))

~CTRL_SWI(*N,N*−1)=~(~SUBDON(*N*) AND POWERON)

wherein the "~" represents a logical inversion operation, and "CTRL_SW(N)" is the control signal for the N-th main switch and "CTRL_SWI(N,N−1)" is the control signal for the pi-switch for power sub-domains N−1 and N.

Figure 7:
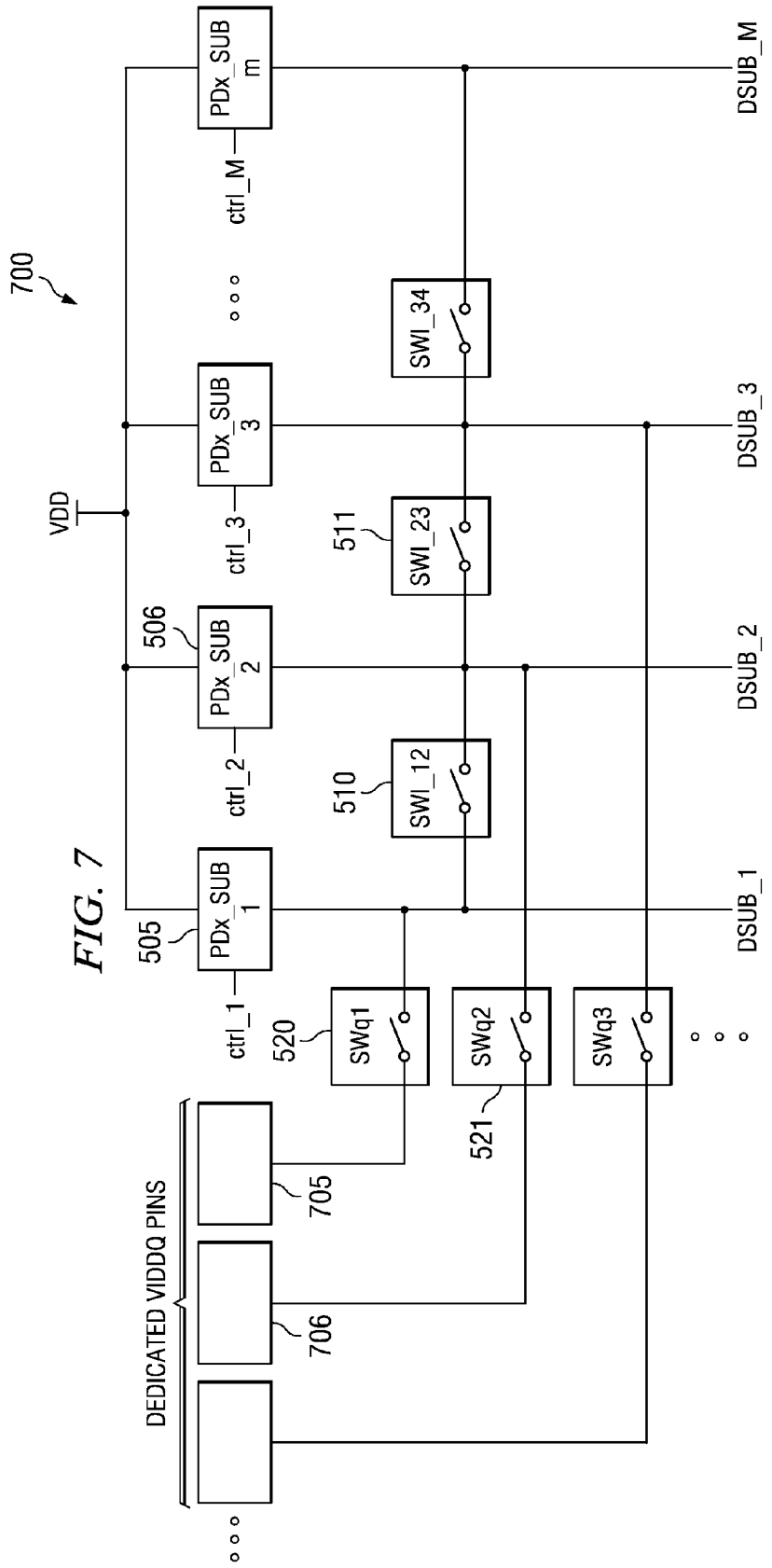
FIG. 7 is a diagram of a switch structure using dedicated IDDQ switches and VIDDQ pins for each sub-domain, enabling parallel IDDQ-based testing of an integrated circuit, according to a preferred embodiment of the present invention.

With reference now to FIG. 7, there is shown a diagram illustrating a switch structure 700 using dedicated IDDQ switches and VIDDQ pins for each sub-domain to enable parallel IDDQ-based testing in an integrated circuit, according to a preferred embodiment of the present invention. In the switch structure 700, the VIDDQ pin 420 (FIG. 4) can be implemented as a plurality of dedicated VIDDQ pins (such as VIDDQ pins 705 and 706). According to a preferred embodiment of the present invention, there is a dedicated VIDDQ pin for each power sub-domain in the integrated circuit. Coupling each of the dedicated VIDDQ pins (such as VIDDQ pin 705) to a corresponding power sub-domain (such power sub-domain DSUB_1) is an IDDQ switch (such as IDDQ switch 520). An advantage in the use of dedicated VIDDQ pins is that the IDDQ current for each of the power sub-domains can be measured in parallel. This can permit the measurement of the IDDQ current for each power sub-domain to occur in a single operation. Note however that the use of dedicated VIDDQ pins can require the use of a large number of input/output pins, a commodity that may not be available in many integrated circuit applications or that may be expensive when available.

The use of pin multiplexing for logic signals is commonly performed in order to reduce the number of pins required for a particular integrated circuit application. For example, in certain microprocessors, some of the pins can function as both address pins and data pins. The multiplexing of pins can reduce the total number of pins required for an application and therefore reduce the overall cost of the integrated circuit. In addition to multiplexing logic signal pins, power supply pins can also be multiplexed. The VIDDQ pins and VDD pins may be multiplexed together to reduce pin count. Note however, that the multiplexing of power supply pins can require special considerations and may only be performed with transistor switches.

Figure 8:
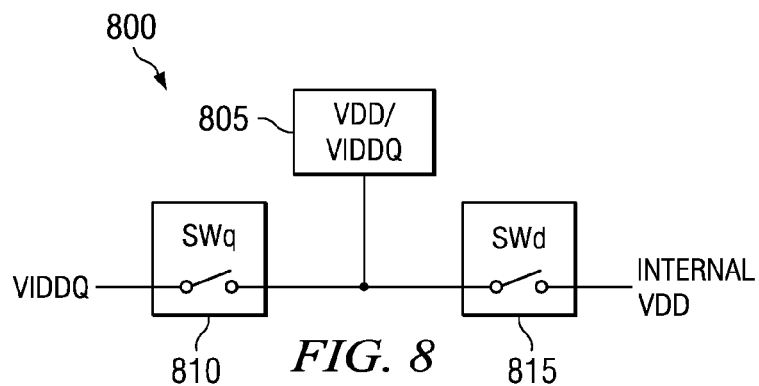
FIG. 8 is a diagram of a multiplexed VDD/VIDDQ pin, according to a preferred embodiment of the present invention.

With reference now to FIG. 8, there is shown a diagram illustrating a multiplexed VIDDQ/VDD pin 800 for use in an integrated circuit, according to a preferred embodiment of the present invention. The multiplexed VIDDQ/VDD pin 800 may appear to be a single pin when view externally, however, the multiplexed VIDDQ/VDD pin 800 can operate in two different modes. In a first mode, the multiplexed VDD/VIDDQ pin 800 can be used to provide power to the integrated circuit and in a second mode, the multiplexed VIDDQ/VDD pin 800 can be used to measure the IDDQ current. In order to operate in these two dissimilar modes, switching must be used to change the operating mode of the multiplexed VIDDQ/VDD pin 800.

Externally, the multiplexed VIDDQ/VDD pin 800 can have a contact pad 805 wherein a power supply can provide power or a current meter can measure the IDDQ current. Internally, a pair of switches 810 and 815 can be used to couple and decouple the contact pad 805 to internal circuitry in the integrated circuit. The switches 810 and 815 may be implemented using transistors, similar to the switches described previously. The switch 810 can be used to couple/decouple the contact pad 805 to a VIDDQ line, while the switch 815 can be used to couple/decouple the contact pad 805 to an internal VDD power rail, with the state of the switches 810 and 815 depending upon the operating mode of the integrated circuit. For example, in a normal operating mode, the switch 810 may be open and the switch 815 may be closed to provide power to the integrated circuit. When the integrated circuit is operating in a test mode, then the switch 810 may be closed and the switch 815 may be open to permit the measurement of the IDDQ current.

Figure 9:
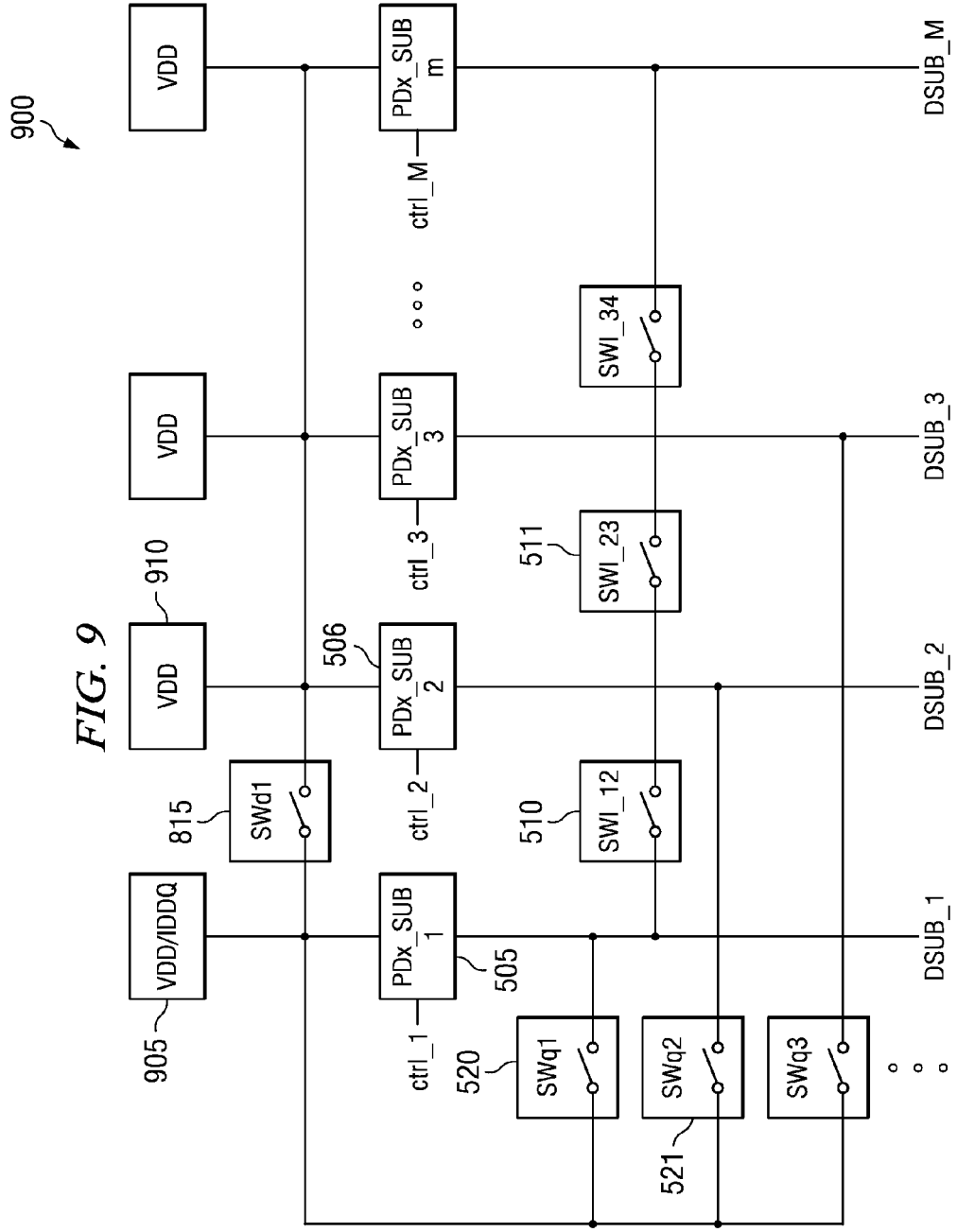
FIG. 9 is a diagram of a switch structure using dedicated IDDQ switches, dedicated main switches, and a multiplexed VIDDQ/VDD pin, according to a preferred embodiment of the present invention.

With reference now to FIG. 9, there is shown a diagram illustrating a switch structure 900 of an integrated circuit using dedicated IDDQ switches, dedicated main switches, and a multiplexed VIDDQ/VDD pin 905 to enable IDDQ-based testing, according to a preferred embodiment of the present invention. As discussed previously, the use of a multiplexed pin can help to reduce the overall number of pins needed for a particular integrated circuit application. For example, in certain circumstances, a reduction of a single pin can enable the use of a smaller and cheaper package for the integrated circuit. The switch structure 900 makes use of a plurality of main switches (such as the main switches 505 and 506), pi-switches (such as the pi-switches 510 and 511), and IDDQ switches (such as the IDDQ switches 520 and 521) in a configuration that is similar to other switch structures discussed above. However, the switch structure 900 features a multiplexed VIDDQ/VDD pin 905 that can operate as either a VIDDQ pin or a VDD pin, depending upon timing and the value of control signals. In addition to the multiplexed VIDDQ/VDD pin 905, the switch structure 900 may have additional VDD pin(s) (such as VDD pin 910). The additional VDD pin(s) can be used as a way to provide power to the integrated circuit other than through the multiplexed VIDDQ/VDD pin 905.

When the multiplexed VIDDQ/VDD pin 905 is operating as a VDD pin, a control signal coupled to a switch 815 can set the switch 815 into a closed state and control signals coupled to the IDDQ switches (such as IDDQ switches 520 and 521) can set the IDDQ switches into an open state. When the multiplexed VIDDQ/VDD pin 905 is operating as a VIDDQ pin, then the control signal coupled to the switch 815 can set the switch 815 into an open state, while an IDDQ switch corresponding to the power sub-domain being measured can be set to a closed state with the remaining IDDQ switches being set to an open state.

Figure 10:
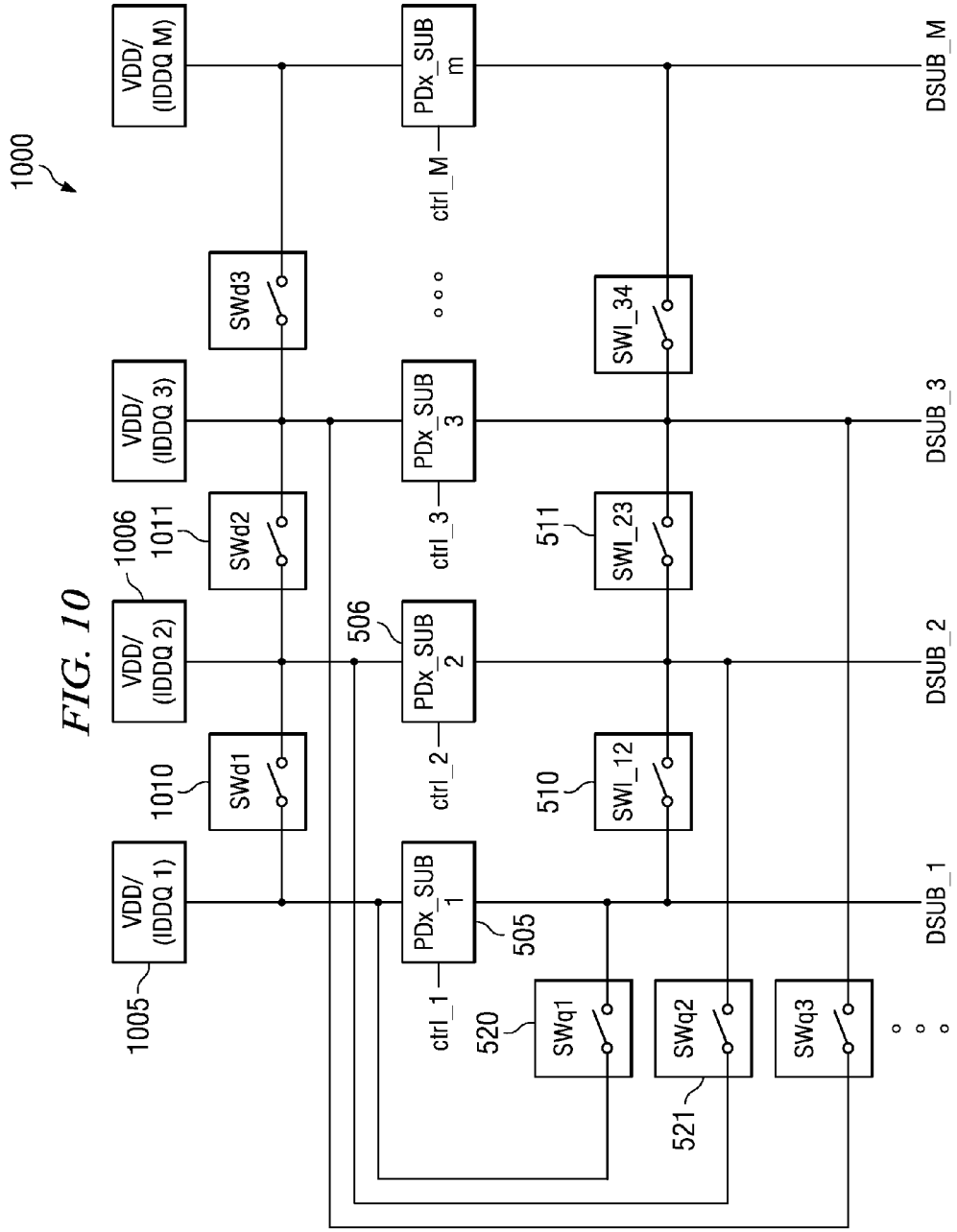
FIG. 10 is a diagram of a switch structure using dedicated IDDQ switches, dedicated main switches, and dedicated multiplexed VIDDQ/VDD pins, according to a preferred embodiment of the present invention.

With reference now to FIG. 10, there is shown a diagram illustrating a switch structure 1000 for an integrated circuit using dedicated IDDQ switches, dedicated main switches, and multiplexed VIDDQ/VDD pins for each sub-domain to enable parallel IDDQ-based testing, according to a preferred embodiment of the present invention. The switch structure 900 (FIG. 9) used a single multiplexed VIDDQ/VDD pin 905 to replace dedicated VIDDQ and VDD pins. When multiple VIDDQ and VDD pins are present in a switch structure, it may be possible to use multiple multiplexed VIDDQ/VDD pins to significantly reduce the pin usage of the integrated circuit while still providing the ability to simultaneously measure the IDDQ current in the different power sub-domains. For example, in an integrated circuit with five (5) power sub-domains, the use of dedicated VDD and VIDDQ pins can require ten (10) pins while the use of multiplexed VIDDQ/VDD pins can reduce the number of pins to five (5).

The switch structure 1000 makes use of a plurality of main switches (such as the main switches 505 and 506), pi-switches (such as the pi-switches 510 and 511), and IDDQ switches (such as IDDQ switches 520 and 521) in a configuration that is similar to other switch structures discussed above. However, the switch structure 1000 features a plurality of multiplexed VIDDQ/VDD pins (such as multiplexed VIDDQ/VDD pin 1005 and 1006) that can operate as either a VIDDQ pin or a VDD pin, depending upon timing and the value of control signals. Additionally, the switch structure 1000 makes use of isolation switches (such as isolation switch 1010 and 1011) to separate the power sub-domains at the power rail, wherein the isolation switches operate in a manner similar to the pi-switches. Note that the isolation switches can be implemented using a design that is similar to that of the pi-switches. When the isolation switches are open, the individual power sub-domains can be entirely disjoint.

When the integrated circuit is operating in a normal operating mode, the multiplexed VIDDQ/VDD pins (such as multiplexed VIDDQ/VDD pin 1005 and 1006) can be configured to operate as VDD pins, the main switches (such as main switch 505 and 506) can be configured to be closed, while the pi-switches (such as pi-switch 510 and 511) and the IDDQ switches (such as IDDQ switch 520 and 521) can be configured to be open. The state of the isolation switches (such as isolation switch 1010 and 1011) can either be open or closed or a combination of some open and some closed. The state of the isolation switches can be dependent upon a desire to minimize voltage ripple and variation between the power sub-domains. When the integrated circuit is operating in a testing mode, the multiplexed VIDDQ/VDD pins can be configured to operate as VIDDQ pins, the main switches can be configured to be open, while the pi-switches and the IDDQ switches can be configured to be closed, and the isolation switches must be configured to be open.

Figure 11:
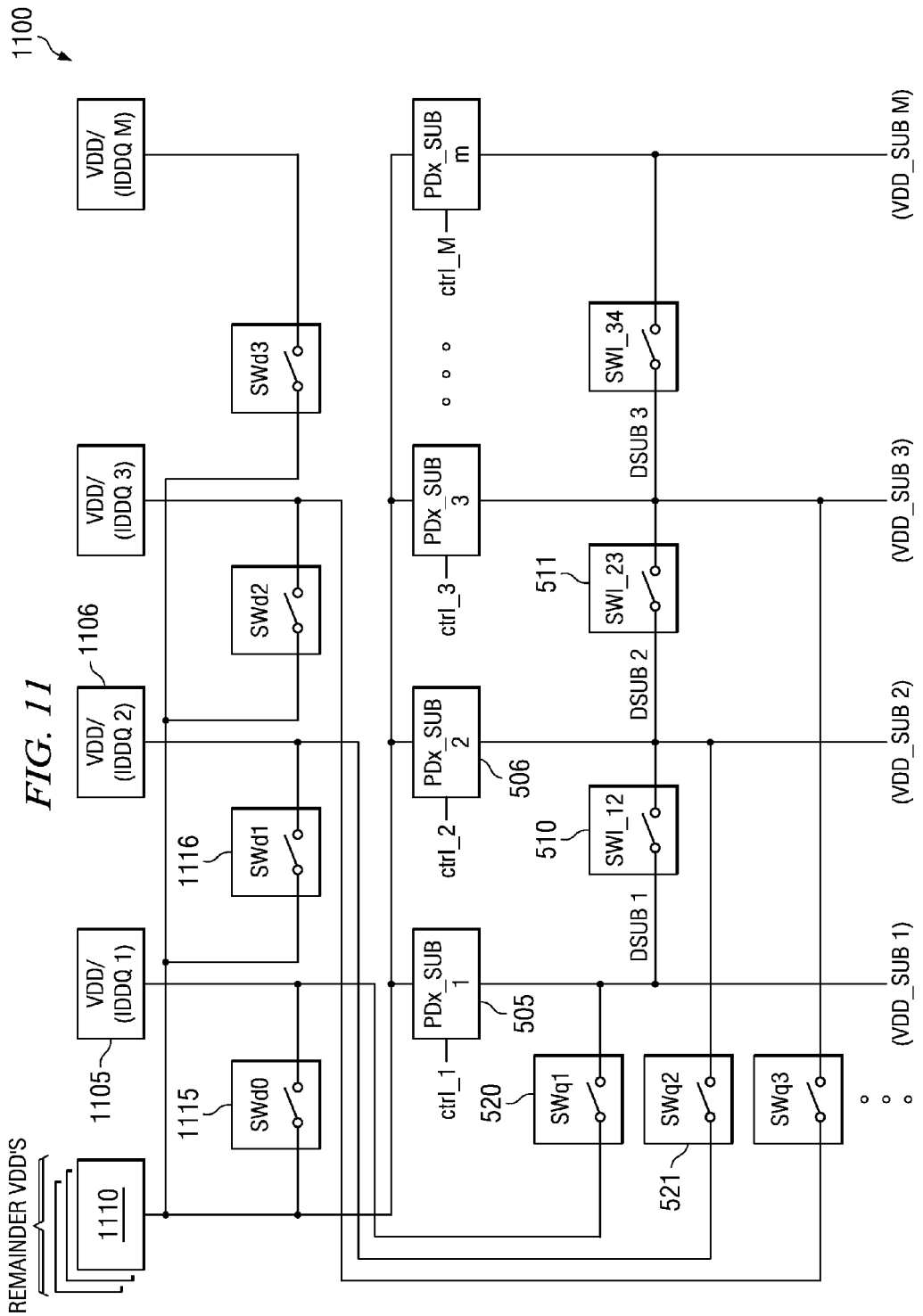
FIG. 11 is a diagram of a switch structure using two-tier pi-switches to enable parallel power sub-domain IDDQ-based testing, according to a preferred embodiment of the present invention.

With reference now to FIG. 11, there is shown a diagram illustrating a switch structure 1100 using two-tier pi-switches to enable parallel power sub-domain IDDQ-based testing in an integrated circuit, according to a preferred embodiment of the present invention. The use of two-tiered pi-switches can permit the parallel measurement of IDDQ current in test mode and the capability of providing a common or distinct voltage levels for each of the power sub-domains. The switch structure 1100 makes use of a plurality of main switches (such as the main switches 505 and 506), pi-switches (such as the pi-switches 510 and 511), and IDDQ switches (such as IDDQ switches 520 and 521) in a configuration that is similar to other switch structures discussed above. However, the switch structure 1100 includes a plurality of multiplexed VIDDQ/VDD pins (such as multiplexed VIDDQ/VDD pin 1105 and 1106) and one or more dedicated VDD pins 1110. The presence of both dedicated VDD pins 1110 and multiplexed VIDDQ/VDD pins 1105 and 1106 can allow the integrated circuit to provide constant power to circuitry within the integrated circuit that require constant power as well as the ability to reduce the number of pins required for the integrated circuit packaging while supporting parallel power sub-domain IDDQ-based testing.

The switch structure 1100 can feature a series of coupling switches (the second tier of pi-switches), such as coupling switch 1115 and 1116 that couple the dedicated VDD pins 1110 to the multiplexed VIDDQ/VDD pins. For example, the coupling switch 1115 coupes the dedicated VDD pins 1110 to the multiplexed VIDDQ/VDD pin 1105 and the coupling switch 1116 couples the dedicated VDD pins 1110 to the multiplexed VIDDQ/VDD pin 1106. Therefore, it can be possible to couple all, some, or none of the multiplexed VIDDQ/VDD pins to the dedicated VDD pins 1110. The use of the coupling switches (the second tier pi-switches) can permit the coupling of power supplies with substantially the same voltage potential together to create a more stable power supply with reduced voltage fluctuations and ripples.

Figure 12:
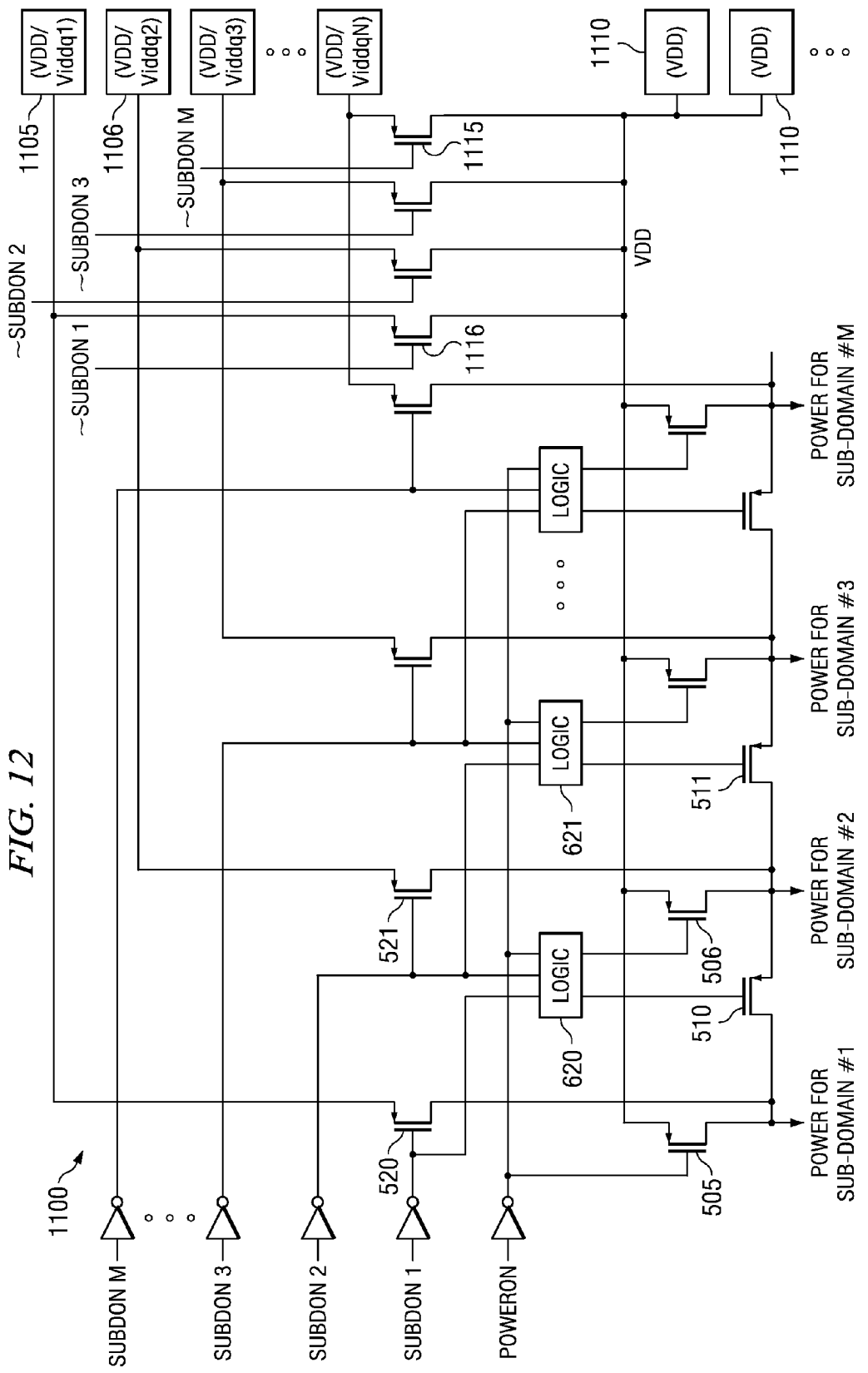
FIG. 12 is a diagram of an implementation of the switch structure shown in FIG. 11, according to a preferred embodiment of the present invention.

With reference now to FIG. 12, there is shown a diagram illustrating a detailed view of an exemplary implementation of the switch structure 1100, according to a preferred embodiment of the present invention. The switch structure 1100 can be implemented in a manner that is similar to the implementation of the switch structure 500 (FIG. 6*a*), wherein a plurality of main switches (such as main switch 505 and 506) can couple the power supply to the individual power sub-domains, a plurality of pi-switches (such as pi-switch 510 and 511) can be used to couple or decouple the power sub-domains together, and a plurality of IDDQ switches (such as IDDQ switch 520 and 521) can couple the multiplexed VIDDQ/VDD pins (such as multiplexed VIDDQ/VDD pin 1105 and 1106) to enable the measurement of the IDDQ current. A series of coupling switches (the second tier of pi-switches), such as coupling switch 1115 and 1116, can couple the power supplies of the power sub-domains together to reduce voltage fluctuations and ripple. Furthermore, the coupling switches can decouple the power sub-domains to enable the measurement of the IDDQ currents. A series of VDD pins (such as VDD pin 1110) may also be present to provide a continuous source of power for circuitry that requires continuous power.

Figure 13:
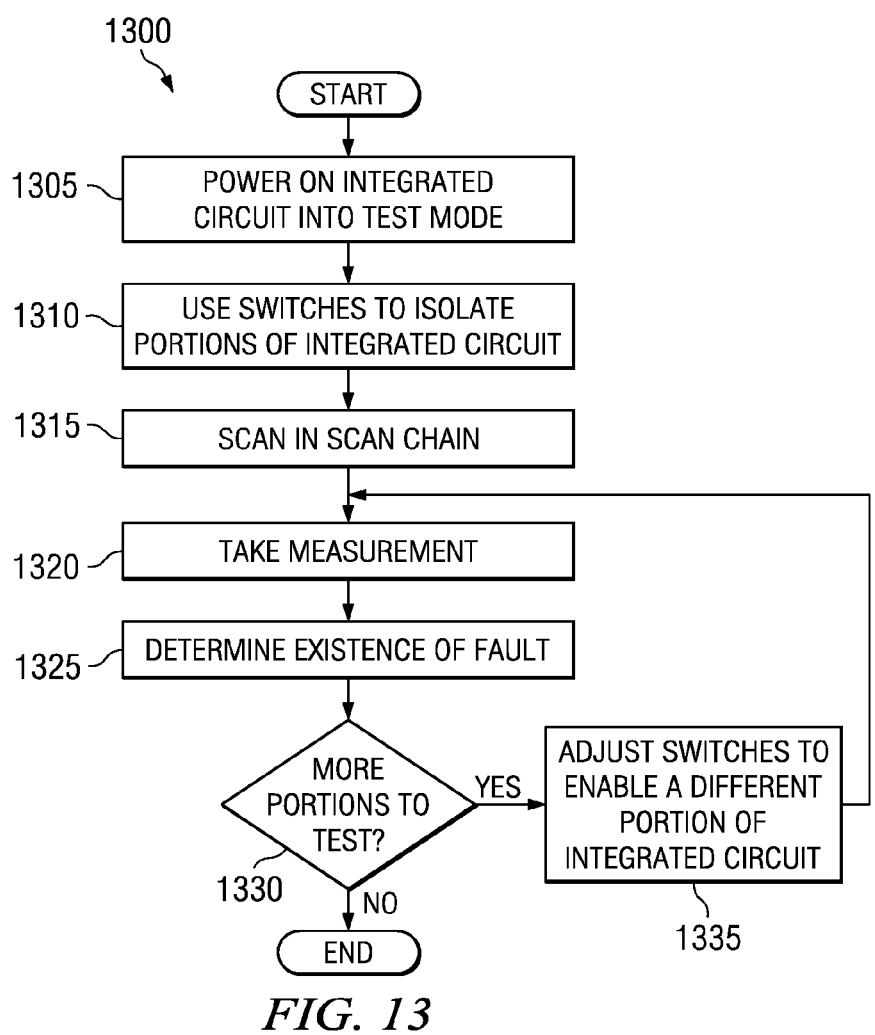
FIG. 13 is a sequence of events in the testing of an integrated circuit using IDDQ current-based testing, according to a preferred embodiment of the present invention.

With reference now to FIG. 13, there is shown a flow diagram illustrating a sequence of events 1300 in the testing of an integrated circuit using IDDQ current-based testing, according to a preferred embodiment of the present invention. The sequence of events 1300 can be representative of a sequence of events taking place in the testing of an integrated circuit, wherein the integrated circuit features switching circuits that allow the measurement of IDDQ currents to determine faulty transistors without the need to power down/power up the integrated circuit between IDDQ current measurements from disjoint power sub-domains.

Initially, the integrated circuit can be brought up (powered on) into a test mode (block 1305). There can be many ways to place the integrated circuit into a test mode, including, holding a certain pin (or pins) at a specified signal level while the power is being applied or setting a value in the integrated circuit to a specified value prior to shutting down the integrated circuit and then applying power to the integrated circuit. Once the integrated circuit is placed into the test mode, the switches (main switches, pi-switches, IDDQ switches, isolation switches, and coupling switches) can be set to the proper states to isolate the power sub-domains of the integrated circuit (block 1310). Refer to the discussion of FIG. 5*b* for a detailed discussion of the setting of the state of the various switches to isolate the different power sub-domains. With the different power sub-domains isolated, test vectors (scan chains) can be scanned in to set the state of circuits in the integrated circuit (block 1315).

The IDDQ current for the different power sub-domains of the integrated circuit can be measured via dedicated VIDDQ or multiplexed VIDDQ/VDD pin(s) (block 1320). Depending upon the design of the switch structure used in the integrated circuit, it may be possible to measure the IDDQ current for each of the different power sub-domains at one time or the measurements of the IDDQ currents may be made in a sequential manner. Using the measurement of the IDDQ current(s), the existence of faulty transistors can be determined (block 1325). If the IDDQ currents were made sequentially, then a check to determine if the IDDQ currents for all of the power sub-domains have been made (block 1330). If there are power sub-domains that have not had their IDDQ currents measured, then the switches in the integrated circuit can be adjusted so that it is possible to measure the IDDQ current in a power sub-domain that has not been measured (block 1335) and then the measurement can be made (block 1320) and the determination of the existence of a fault (block 1325) can be repeated. If all of the power sub-domains have had their IDDQ currents measured, then the testing of the integrated circuit is complete.

Figure 14:
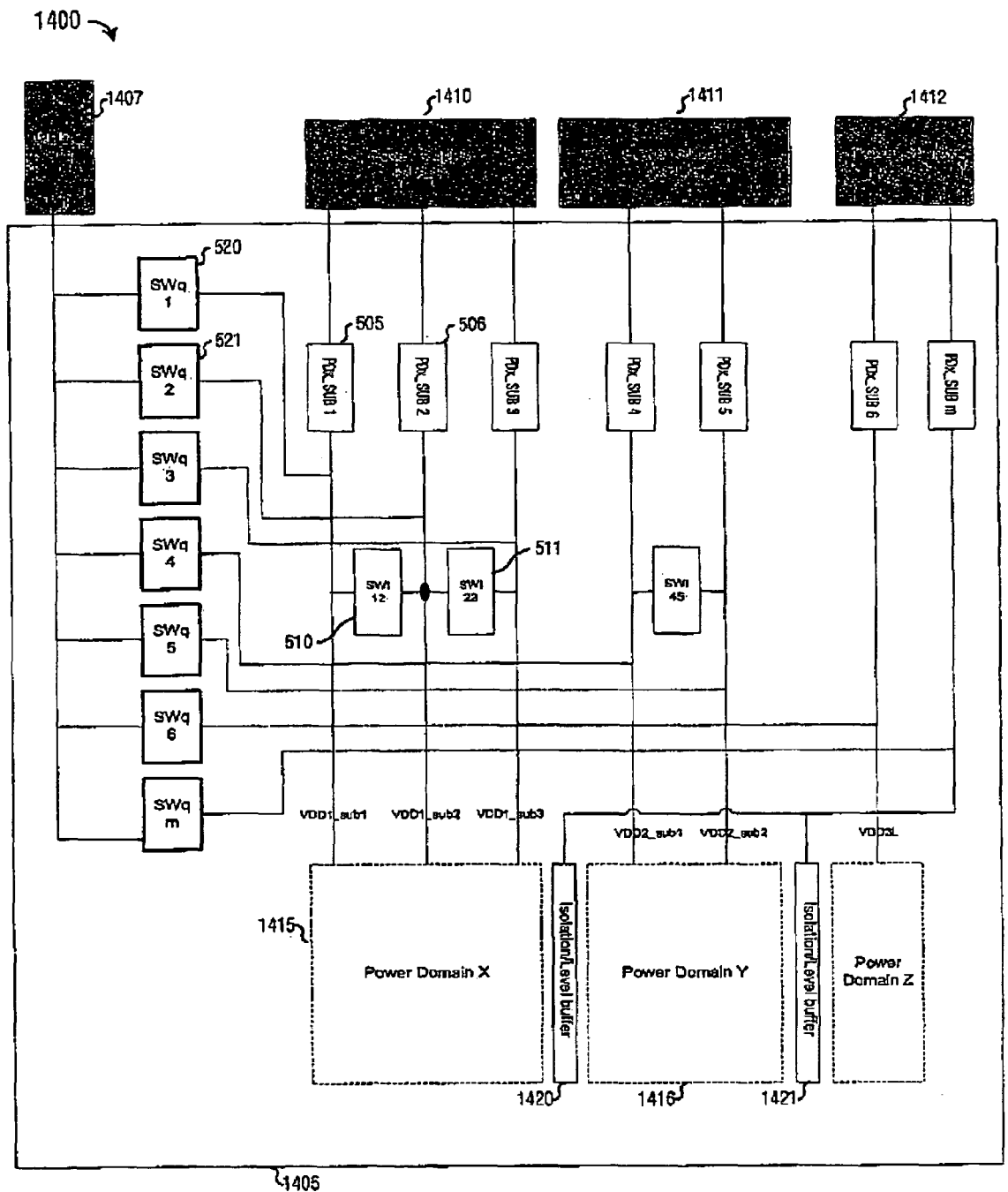
FIG. 14 is a diagram of a switch structure for an integrated circuit wherein the integrated circuit has multiple power domains, according to a preferred embodiment of the present invention.

With reference now to FIG. 14, there is shown a diagram illustrating a switch structure 1400 for an integrated circuit with multiple power domains/voltage domains on a system-on-a-chip 1405, according to a preferred embodiment of the present invention. The use of dedicated/multiplexed IDDQ switches, dedicated/multiplexed VIDDQ/VDD pins, and dedicated main switches can be used to not only provide IDDQ-based testing in integrated circuits with single power domains/voltage domains. They can also be used in applications that have a need for multiple power domains/voltage domains, such as in a system-on-a-chip (SOC). In a SOC, such as SOC 1405, there can be different systems integrated onto a single integrated circuit. These systems may have different power/voltage requirements. Therefore, there can be a need for multiple power domains/voltage domains.

As shown previously, the switch structure 1400 can make use of a plurality of main switches (such as the main switches 505 and 506), pi-switches (such as the pi-switches 510 and 511), and IDDQ switches (such as the IDDQ switches 520 and 521) in a configuration that can be similar to other switch structures discussed above. The plurality of main switches, pi-switches, and IDDQ switches can be used to permit IDDQ-based testing. However, rather than having a common power supply, such as power supply "VDD" as shown in FIG. 7, several independent power supplies can be used in the switch structure 1400. For example, VIDDQ pin 1407 can be used to measure IDDQ current while power supply "VDD1" 1410 and power supply "VDD2" 1411, can be used to provide power to separate power domains, such as power supply "VDD1" 1410 providing power to power domain X 1415 and power supply "VDD2" 1411 providing power to power domain Y 1416. The individual power domains, such as the power domain X 1415 and the power domain Y 1416, can be separated from one another by isolation buffers (or level shifters), such as isolation buffer 1420 separating power domain X 1415 and power domain Y 1416. Isolation buffer 1421 serves a similar function for other power domains. The isolation buffers 1420 and 1421 can be powered by one or more of the power supplies. A power supply "VDD3" 1412 is shown as providing power to the isolation buffers 1420 and 1421. Note that the isolation buffers need not be powered by the same power supply. For example, an isolation buffer can be powered by a power supply for one of the power domains that it is separating.

Although there is a distinct separation of the different power domains through the use of isolation buffers 1420 and 1421, the structure of the main switch 1400 remains similar to previously discussed main switches, such as the main switch 900 (FIG. 9) for example. Within a single power domain, for example, power domain X 1415, pi-switches 5 10 and 511 can be used to couple or separate the power sub-domains, while main switches 505 and 506 can be used to couple or de-couple the power supply "VDD1" 1410 to the power domain X 1415. When IDDQ-based testing is desired, then the IDDQ switches 520 and 521 (among others) can be used couple the power sub-domains to the VIDDQ pin 1407. Since the power supplies, such as power supply "VDD1" 1410 and power supply "VDD2" 1411, can be at different voltage potentials, it should be ensured that when the VIDDQ pin 1407 is being used, the power supply to which the VIDDQ pin 1407 is coupled should be set to provide the correct voltage. Additionally, note that in between separate power domains, such as between power domain X 1415 and power domain Y 1416, there are no pi-switches since there is no desire to couple the separate power domains together. The switch structures 400 (FIG. 4), 500 (FIG. 5a), 700 (FIG. 7), 900 (FIG. 9), 1000 (FIG. 10), and 1100 (FIG. 11) can be readily modified by persons of ordinary skill in the art of the present invention so that they can support multiple power domains.

In order to study the effectiveness of the use of individual main switches (such as main switches 410 and 411) for each power sub-domain in detecting transistor failures when compared to a single main switch for all power sub-domains, simulation studies have been performed.

Figure 15A:
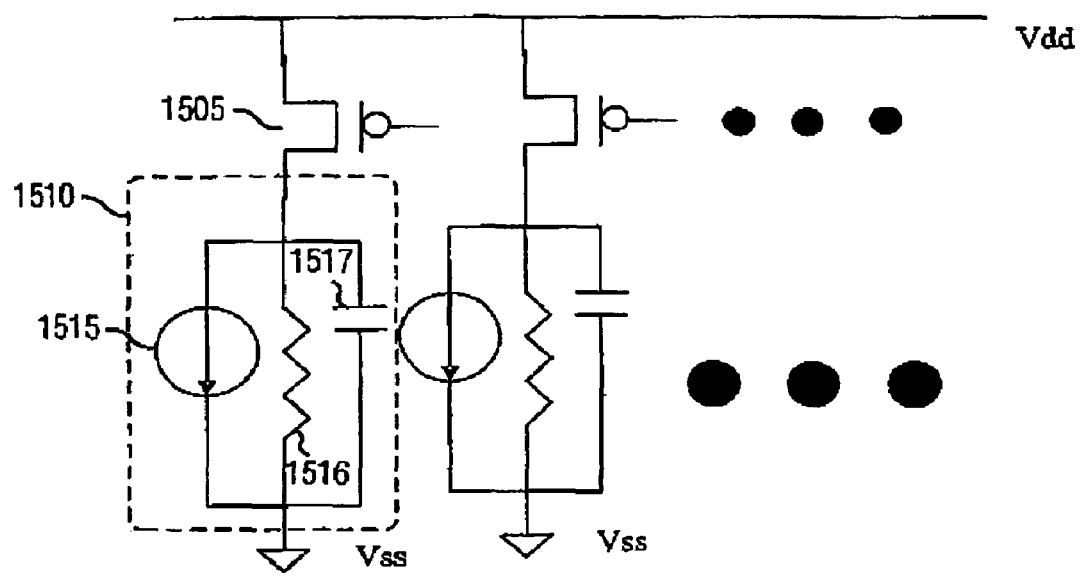
FIGS. 15a and 15b are diagrams of circuit models of the switch structure with separate and common IDDQ switches used for simulation studies, according to a preferred embodiment of the present invention.
Figure 15B:
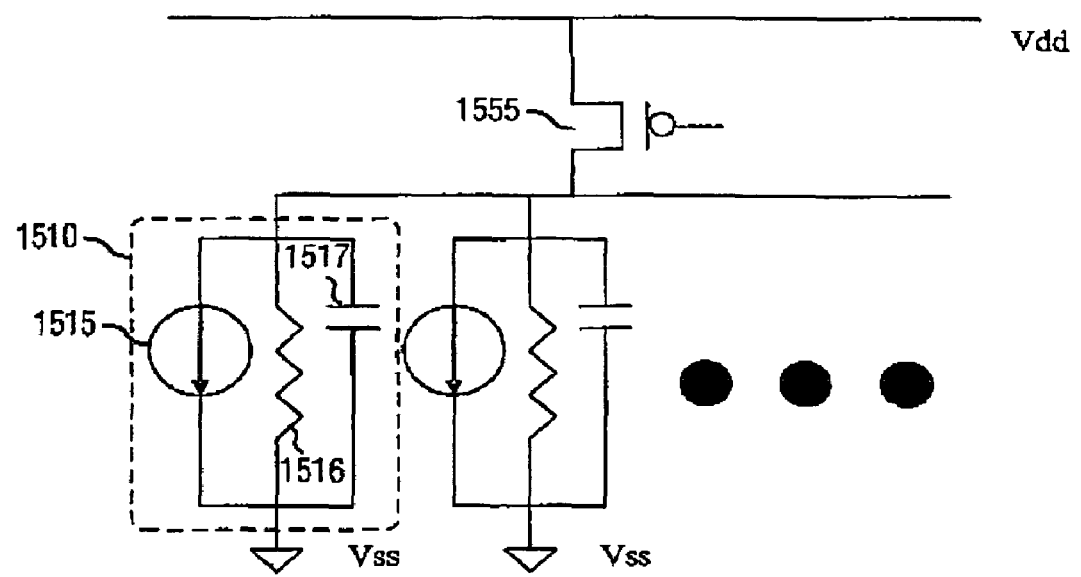

With reference now to FIGS. 15a and 15b, there are shown diagrams illustrating circuit models for switch structures with separate main switches (IDDQ switches) for each power sub-domain (FIG. 15a) and with a single main switch for all power sub-domains (FIG. 15b), according to a preferred embodiment of the present invention. The diagram shown in FIG. 15a illustrates a circuit model for a switch structure with individual main switches (such as main switch 1505) for each power sub-domain (such as power sub-domain 1510). The main-switch 1505 can be modeled as a large transistor, while the power sub-domain 1510 can be represented with three components connected in parallel. A first component of the power sub-domain 1510 is a current source 1515 that is used to represent a current produced by a possible stuck-at fault, a second component is a resistor 1516 that is used to represent a leakage current, and a third component is a capacitor 1517 that is used to represent the capacitance between a local VDD and VSS. The diagram shown in FIG. 15b is similar with the exception of a main switch 1555 (represented by a transistor) replaces the individual main switches (such as the main switch 1505). Each power sub-domain shown in the diagram in FIG. 15b has the same circuit model as the power sub-domains shown in the diagram in FIG. 15a.

For an N-th power sub-domain with a P-th IDDQ pattern in place (an IDDQ pattern is a test vector pattern scanned in to set the state of transistors in the circuitry being tested), the current provided by a current source (such as the current source 1515), denoted $I_{NP}$, is equal to zero (0) if there is no stuck-at fault and $I_{SA}$ if there is one stuck-at fault, wherein ISA is representative of a single transistor stuck-at fault current and can range from 200 micro-amps to 600 micro-amps, depending upon technology and manufacturing process. The leakage current, denoted $I_{leakNP}$, is equal to $N_{NP}*i_0$, wherein $i_0$ is the leakage current for a single gate and $N_{NP}$ is the equivalent number of gates for the particular P-th IDDQ pattern. The equivalent capacitance, denoted $C_{NP}$, is equal to an equivalent capacitance between VDD and VSS for the particular P-th IDDQ pattern.

In a switch structure configuration wherein there are individual main switches for each power sub-domain (such as shown in FIG. 15a), the IDDQ current measured at an N-th power sub-domain for a P-th IDDQ pattern can be expressed as: $I_{NP}=N_{NP}*i_0+I_{SA}$ if the P-th IDDQ pattern detects a stuck-at fault while $I_{NP}=N_{NP}*i_0$ if the P-th IDDQ pattern does not detect a stuck-at fault. Clearly, if a measured $N_{NP}$ is larger than $I_{SA}$, then a stuck-at fault is possible.

In a switch structure configuration with a single main switch (such as shown in FIG. 15b), the IDDQ current measured can be expressed as: $I_P=\Sigma I_{MP}=\Sigma(N_{MP}*i_0)+I_{SA}$ if there is a stuck-at fault and $I_P=\Sigma N_{MP}*i_0$ if there is no stuck-at fault, wherein M is the number of power sub-domains.

Additionally, a measure of the sensitivity of the stuck-at fault test can be defined as: $S=I_{MP}$(stuck-at fault)$/I_{MP}$(no stuck-at fault)$-1$. For the individual main switch per power sub-domain case, $S=I_{SA}/(N_{MP}*i_0)$, which is greater than one (1). For the single main switch case, $S=ISA/(\Sigma N_{MP}*i_0)$, which is greater than 1/M, wherein M is the number of power sub-domains.

According to a preferred embodiment of the present invention, the size of the main switch for each power sub-domain is designed to be capable of supplying an $I_{SA}$ current with a drop of approximately 5 percent in the VDD voltage. Furthermore, the typical power on resistance of the main switch is on the order of 25 K ohms. This is approximately one-thousandths the size of a main power switch. Therefore, the area impact of the use of the main switches is very small.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A switch structure comprising:
   a plurality of power sub-domains;

a plurality of main switches, wherein each main switch selectively couples a different power sub-domain to a power supply;

a plurality of IDDQ switches, wherein each IDDQ switch selectively couples a power sub-domain to a VIDDQ pin, wherein there is one main switch and one IDDQ switch for each power sub-domain; and a plurality of pi-switches coupled between power sub-domains.

2. The switch structure of claim 1, wherein all main switches are coupled to a a single power supply and wherein all IDDQ switches are coupled to a single VIDDQ pin.

3. The switch structure of claim 1 further comprising a current measuring device coupled to the VIDDQ pin and operable to measure a current drawn.

4. The switch structure of claim 3 further comprising a scan memory operable to store test vectors from a measurement of the current drawn.

5. The switch structure of claim 1 further comprising a current measuring device coupled to the VIDDQ pin and operable to measure a current drawn and wherein the main switches and pi-switches comprise MOSFET transistors.

6. The switch structure of claim 5 further comprising a scan memory operable to store test vectors from a measurement of the current drawn.

7. The switch structure of claim 1, wherein the main switches and pi-switches comprise MOSFET transistors and a width of the pi-switches MOSFET transistors is smaller than a width of the main switches MOSFET transistors.

8. A switch structure comprising:

a plurality of main switches, wherein each main switch selectively couples a power sub-domain to a power supply;

a plurality of IDDQ switches, wherein each IDDQ switch selectively couples a power sub-domain to a VIDDQ pin, wherein there is one main switch and ore IDDQ switch for each power sub-domain;

a plurality of pi-switches coupled between power sub-domains;

a current measuring device coupled to the VIDDQ pin and operable to measure a current drawn and wherein the main switches and pi-switches comprise MOSFET transistors;

wherein a width of the pi-switches MOSFET transistors is smaller than a width of the main switches MOSFET transistors; and a scan memory operable to store test vectors from a measurement of the current drawn.

* * * * *